United States Patent
Schäfer et al.

(10) Patent No.: US 6,632,341 B1
(45) Date of Patent: Oct. 14, 2003

(54) METHOD FOR PRODUCING A SELF-SUPPORTING METAL FILM

(75) Inventors: Axel Schäfer, Tuningen (DE); Oswald Beetz, Nürnberg (DE); Jürgen Hackert, Grünbach (DE)

(73) Assignee: Bolta-Werke GmbH (DE)

( * ) Notice: Subject to any disclaimer, the term of this patent is extended or adjusted under 35 U.S.C. 154(b) by 0 days.

(21) Appl. No.: 09/857,832

(22) PCT Filed: Dec. 1, 1999

(86) PCT No.: PCT/DE99/03906

§ 371 (c)(1),
(2), (4) Date: Feb. 27, 2002

(87) PCT Pub. No.: WO00/36188

PCT Pub. Date: Jun. 22, 2000

(30) Foreign Application Priority Data

Dec. 11, 1998 (DE) .......................... 198 57 157

(51) Int. Cl.[7] .............................. C25D 1/04; C25D 5/48
(52) U.S. Cl. ........................ 205/77; 205/96; 205/111; 205/182; 205/194
(58) Field of Search .................. 205/76, 77, 96, 205/111, 125, 126, 182, 194, 920

(56) References Cited

U.S. PATENT DOCUMENTS

| | | | |
|---|---|---|---|
| 3,198,672 A | * 8/1965 | De Hart | 148/269 |
| 3,674,656 A | 7/1972 | Yates | |
| 3,901,785 A | 8/1975 | Buzhinskaya et al. | |
| 4,409,037 A | * 10/1983 | Landau | 148/269 |
| 4,490,218 A | * 12/1984 | Kadija et al. | 205/77 |
| 4,692,221 A | 9/1987 | Parthasarathi | |
| 4,969,958 A | * 11/1990 | Mombrun et al. | 148/269 |
| 5,019,221 A | 5/1991 | Khalid et al. | |
| 5,215,646 A | 6/1993 | Wolski et al. | |

FOREIGN PATENT DOCUMENTS

| | | |
|---|---|---|
| DE | 131 044 | 5/1978 |
| EP | 0 063 347 | 10/1982 |
| EP | 0 392 151 | 10/1990 |

OTHER PUBLICATIONS

Database WPI, Section Ch, Week 198135, Derwent Publications Ltd., London, Great Britain; AN 1981–63507D, XP002146592 & JP 56 087677 A (Nippon Mining Co), Jul. 16, 1981.

* cited by examiner

*Primary Examiner*—Roy King
*Assistant Examiner*—William T. Leader
(74) *Attorney, Agent, or Firm*—Bachman & LaPointe, P.C.

(57) ABSTRACT

Described is a process for producing a self-supporting metal foil (40), in particular copper foil, which by virtue of its constitution has a low shearing strength and which can be structured in a sharp-edged configuration. In this case a base layer of the metal foil (40) is galvanically deposited on a roller cathode (22). A cauliflower structure (60) comprising the metal is deposited in firmly adhering relationship on the metal base layer (58) by means of an additional anode (32) provided between the roller cathode (22) and the anode cage (24). The metal foil (40) comprising the metal base layer (58) and the cauliflower structure (60) is detached from the roller cathode (22), rinsed and dried. The dried foil (40) comprising the metal base layer (58) provided with the cauliflower structure (60) is moved through a black oxide bath (46). There then follows a rinsing operation and a drying operation.

2 Claims, 3 Drawing Sheets

METHOD FOR PRODUCING A SELF-SUPPORTING METAL FILM

BACKGROUND OF THE INVENTION

The invention concerns a process for producing a self-supporting foil, in particular a copper foil, which by virtue of its constitution has a low shearing strength and can be structured in a sharp-edged configuration, wherein the metal foil is galvanically deposited on a rotating roller which forms a cathode and which is dipped into an electrolyte bath containing ions of the metal, an anode cage is provided at a constant spacing from the roller cathode and a defined adjustable dc voltage is applied during rotation of the roller cathode to the roller cathode and the anode cage so that a given adjustable high direct current flows between the roller cathode and the anode cage in the electrolyte bath, by which direct current a metal base layer is deposited on the roller cathode, at least one additional anode is provided between the roller cathode and the anode cage, a defined adjustable second dc voltage is applied between the roller cathode and the additional anode so that a given adjustable additional direct current flows between the roller cathode and the additional anode, whereby a cauliflower structure comprising the metal is deposited in firmly adhering relationship on the outside of the metal base layer, which is remote from the roller cathode, the metal foil comprising the metal base layer provided with the cauliflower structure is detached from the roller cathode, and the metal foil comprising the metal base layer provided with the cauliflower structure is rinsed and dried.

EP 0 063 347 discloses a metal foil which is used as a stamping foil and which is transferred on to a substrate by means of a suitable stamping member. In order to fix that known metal foil which can be structured in a sharp-edged configuration to the above-mentioned substrate, use is made of an adhesive which is preferably a hot melt adhesive. Such an adhesive represents an electrically insulating layer so that electrically conductive contacting of the metal foil which can be structured in a sharp-edged configuration with the substrate is not possible there. In regard to electrically insulating substrates, that is not a material consideration, but the circumstances are different in regard to ohmically conducting substrates.

EP 0 392 151 A2 proposes integrating solder powder particles into the adhesive layer between the metal foil and the substrate in order to make an electrically conducting connection between a substrate and such a metal foil which can be structured in a sharp-edged configuration.

Irrespective of whether solder powder particles are or are not integrated into the adhesive layer, the metal foil which can be structured in a sharp-edged configuration requires the adhesive layer to be applied to the side of the foil, which is towards the substrate. That represents a not inconsiderable production complication and expenditure.

U.S. Pat. No. 5,019,221 discloses an apparatus for the galvanic production of a metal foil such as a copper foil, on a roller cathode which dips into an electrolyte bath containing ions of the metal. An anode cage is disposed at a spacing from the roller cathode. The anode cage is in concentric relationship with the roller cathode. A defined dc voltage is applied to the roller cathode and the anode cage. The roller cathode is driven in rotation at the same time. As a result of the dc voltage a given high direct current flows between the roller cathode and the anode cage, with the metal foil thus being deposited on the roller cathode in the form of a metal base layer. On its outside which is remote from the roller cathode, that known metal foil involves a relatively low degree of surface roughness. The surface roughness of a copper foil produced in that way is at a maximum between 5 and 6 $\mu$m. As a consequence of that degree of surface roughness, it has not been possible hitherto for such a known metal or copper foil to be applied directly to a substrate, while being structured in a sharp-edged configuration, without an adhesive layer.

U.S. Pat. Nos. 4,692,221 or 5,215,646 each disclose a process of the kind set forth in the opening part of this specification, for producing a metal foil, in particular a copper foil, which in comparison with a metal foil and in particular a copper foil without a cauliflower structure, as a consequence of its increased surface roughness, enjoys improved adhesion after having been embossed on to a substrate.

SUMMARY OF THE INVENTION

The object of the invention is so to develop a process of the kind set forth in the opening part of this specification that it is possible to produce a metal foil, in particular a copper foil, whose adhesive strength after embossing on to a substrate is still further improved.

In accordance with the invention in a process of the kind set forth in the opening part of this specification, that object is attained in that the dried metal foil comprising the metal base layer provided with the cauliflower structure is moved through a black oxide bath, and the metal foil comprising the metal base layer provided with the cauliflower structure, subsequently to the black oxide bath, is rinsed and dried.

The process steps according to the invention provide that the shearing strength of the metal foil when embossed on to a substrate is further improved.

The anode cage can be for example at a constant spacing from the roller cathode, which for example can be of the order of magnitude of around 50 mm. The at least one additional anode between the anode cage and the roller cathode can for example have an anode bar which is at a constant spacing from the roller cathode, which spacing can be of the order of magnitude of between 2 and 3 mm. The metal base layer, in particular copper, is deposited on the rotating roller cathode by means of the anode cage. Depending on the dc voltage applied to the roller cathode and the anode cage, and the direct current flowing therebetween, that base layer can be of the order of magnitude of between 10 and 100 $\mu$m. The at least one additional anode between the roller cathode and the anode cage, depending on the second dc voltage applied between them and the additional direct current produced thereby, produces the cauliflower structure consisting of the metal or the copper, on the metal, in particular copper, base layer. That cauliflower structure involves a surface roughness of between 10 and 25 $\mu$m The metal foil, in particular the copper foil, consisting of the base layer and the cauliflower structure therefore advantageously entails such a level of surface roughness that the cauliflower structure is hookingly engaged to the substrate, thus affording a high level of shearing strength for the foil on the substrate virtually independently of the material of the substrate. The substrate may be for example an electrically or ohmically conducting body. If such a body is embossed with the foil produced in accordance with the invention, in a condition of being structured in a sharp-edged configuration, it can be used for example as a resistance heating element. The foil produced in accordance with the invention can also be applied to an electrically insulating substrate in a condition of being structured in a sharp-edged configuration, in order for example to produce a circuitry structure with a high power consumption. It is likewise possible for the foil which is produced in accordance with the invention and which can be structured in a sharp-edged configuration to be embossed on to a substrate having an adhesive layer, or for the foil to be provided with an adhesive layer in order for it to be embossed on to any substrate in a condition of being structured in a sharp-edged configuration.

It is desirable if the speed of rotation of the roller cathode and the dc voltage as between the roller cathode and the anode cage are adapted to each other in order to produce the metal and in particular copper base layer in a given thickness. That means that the thickness of the metal and in particular copper base layer is directly proportional to the dc voltage between the roller cathode and the anode cage and consequently to the direct current between the roller cathode and the anode cage and it is inversely proportional to the speed of rotation of the roller cathode.

In order to provide a given thickness or height of the metal cauliflower structure on the metal base layer, the additional dc voltage between the additional anode and the roller cathode and the speed of rotation of the roller cathode can be suitably adapted to each other. The consideration in regard to the thickness or height of the metal cauliflower structure on the metal base layer is similar to the thickness of the metal base layer, in that the thickness or height of the metal cauliflower structure is directly proportional to the additional dc voltage between the additional anode and the roller cathode and the additional direct current flowing therebetween and it is inversely proportional to the speed of rotation. Consequently, by suitably adjusting the additional dc voltage and the speed of rotation of the roller cathode, it is specifically and targetedly possible to adjust the thickness or height of the metal cauliflower structure as desired at between 10 and 25 $\mu$m. A greater thickness or height for the metal cauliflower structure is less meaningful because then particles of the cauliflower structure become detached therefrom, which is unwanted. A smaller thickness or height of the metal cauliflower structure than 10 $\mu$m is also not appropriate because then the adhesive strength of the metal foil produced in accordance with the invention, which can be structured in a sharp-edged configuration, does not enjoy the desired shearing strength after being embossed on to a substrate.

In accordance with the invention the metal foil comprising the metal base layer provided with the cauliflower structure is moved after the rinsing and drying operations through a black oxide bath. Subsequently to the black oxide bath, in accordance with the invention a rinsing operation and a drying operation are carried out. The metal foil, in particular a copper foil, which is produced in accordance with the invention in that way and which, by virtue of its constitution, has a low level of shearing strength and consequently can be structured in a sharp-edged configuration by embossing not only has a cauliflower structure by virtue of the treatment in the black oxide bath, but a fibrous hairy cauliflower structure by which the shearing strength of the metal foil embossed to a substrate is advantageously improved.

BRIEF DESCRIPTION OF THE DRAWINGS

Further details, features and advantages will be apparent from the description hereinafter of an apparatus which is diagrammatically illustrated in the Figure for carrying out the process according to the invention, a portion on a greatly enlarged scale from a copper foil produced in accordance with the invention and a graph for illustrating the shearing strength of a metal or copper foil produced in accordance with the invention, embossed on to substrates of various plastic materials. In the drawing.

DETAILED DESCRIPTION

Figure 1:
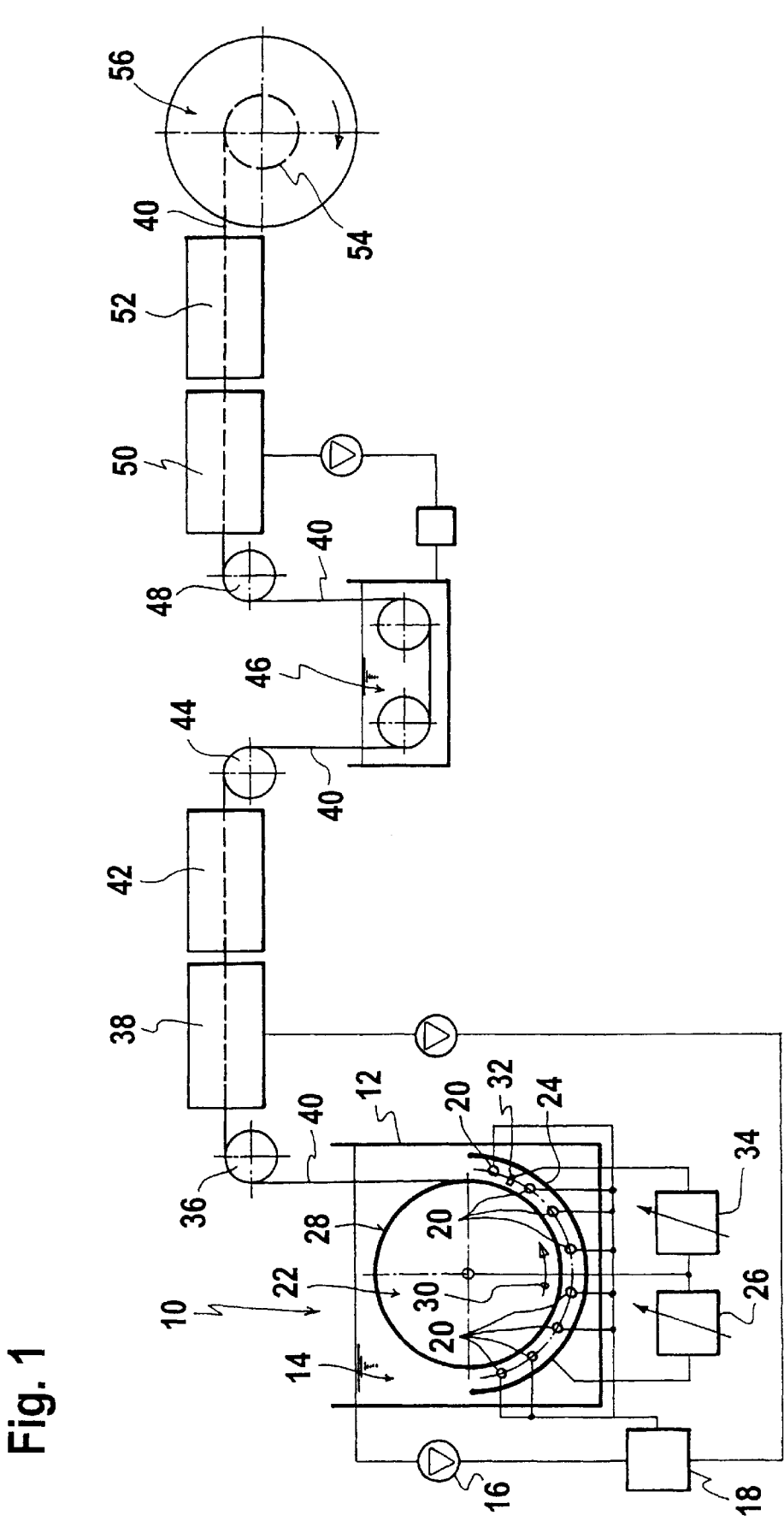
FIG. 1 diagrammatically shows an apparatus for carrying out the process for the production of a metal and in particular a copper foil.

FIG. 1 shows an electrolyte bath 10 which contains an electrolyte 14 in a tank 12. The electrolyte 14 is circulated by means of a pump 16 and a filter or cleaning and regenerating device 18 arranged downstream of the pump. For that purpose, rinsing tubes 20 are provided in the tank 12 of the electrolyte bath 10.

A roller cathode 22 and an anode cage 24 are dipped into the electrolyte 14 of the electrolyte bath 10. The anode cage 24 is definedly spaced from the roller cathode 22; it is arranged concentrically with respect to the roller cathode 22. The rinsing tubes 20 are disposed in the intermediate spaces between the roller cathode 22 and the anode cage 24. The roller cathode 22 and the anode cage 24 are connected together with a first dc voltage source 26 by means of which a correspondingly high direct current flows in the electrolyte 14 between the roller cathode 27 and the anode cage 24. This direct current is the ion flow of the metal or copper ions provided in the electrolyte 14, towards the roller cathode 22. The said ions are deposited on the cylindrical peripheral surface 28 of the roller cathode 22. The roller cathode 22 is driven at a given speed of rotation. This is indicated by the arcuate arrow 30. The metal or copper ions which are deposited on the cylindrical peripheral surface 28 form on the cylindrical peripheral surface 28 of the roller cathode 22 a metal or copper base layer.

Also provided between the roller cathode 22 and the anode cage 24 is an additional anode 32 which is in the form of a rod or bar and which is oriented in the axial direction of the roller cathode 22. The additional anode 32 is at a substantially smaller spacing from the roller cathode 22 than the anode cage 24. The additional anode 32 and the roller cathode 22 are connected together with a second dc voltage source 34. The voltage of the first dc voltage source 26 and the voltage of the second dc voltage source 34 can be set as desired independently of each other. The second dc voltage source 34 produces a corresponding metal or copper ion flow in a direction from the additional anode 32 to the roller cathode 22. That additional direct current produces on the outside of the metal base layer, which is remote from the roller cathode 22, a cauliflower structure comprising the metal or the copper, which is deposited on the metal base layer in a firmly adhering condition if the voltage of the second dc voltage source 34 is suitably adjusted. The additional anode 32 can be radially displaceable for the same purpose.

The metal base layer which is deposited on the cylindrical peripheral surface 28 of the roller cathode 22 in that way, with the firmly adhering cauliflower structure, is continuously detached from the rotating roller cathode 22, deflected around a first deflection roller 36 and moved through a rinsing device 38. In that rinsing device 38, electrolyte which adheres to the metal foil 40, in particular copper foil, is rinsed off the metal foil 40 and, after regeneration, fed back to the electrolyte bath 10 again. The metal foil 40 which is cleaned in that way is moved subsequently to that rinsing operation through a drying device 42 in which the metal foil 40 is dried.

Thereafter, the dried metal or copper foil 40 is deflected around a second deflection roller 44 and transported through a black oxide bath 46. Such a black oxide bath 46, that is to say the corresponding bath solution, is available on the market comparatively inexpensively. For example, such a black oxide bath solution can be obtained from Blasberg, Riedel, as can be seen from the prospectus from that company 'Verfahrensanleitung ENBOND MB 500', pages 1 through 7.

The metal foil 40 coated with black oxide, when it comes out of the black oxide bath 46, is deflected around a third deflection roller 48 and thereafter conveyed through a second rinsing device 50 in which excess black oxide solution is removed from the metal, in particular copper foil 40. The second rinsing device 50 is followed in the direction of transportation movement or advance movement of the metal foil 40 at a downstream location by a second drying device 52 in which the metal foil comprising the metal base layer and the cauliflower structure provided with black oxide is dried to afford the finished foil product. That finished foil product can then be wound for example on to a bar 54 of a winding reel 56.

Figure 3:
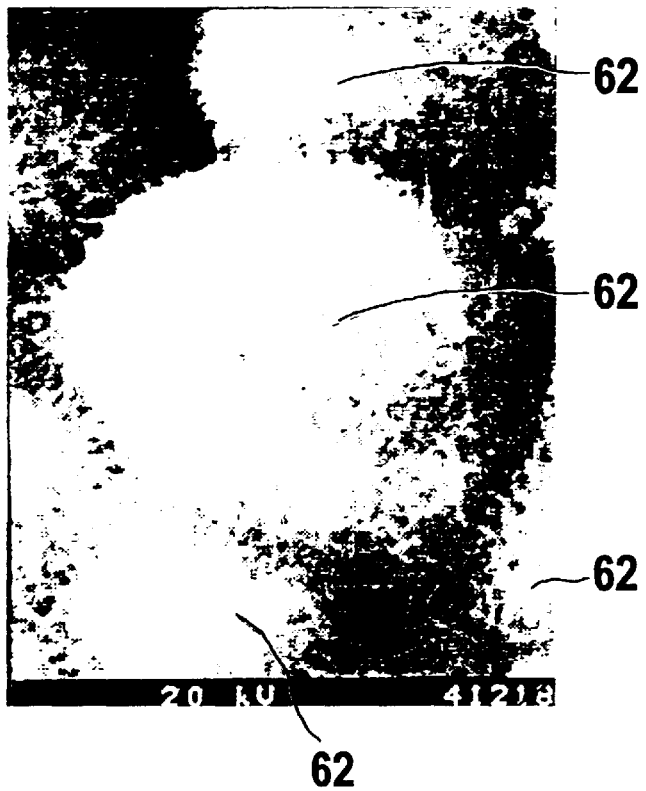
FIG. 3 shows a detail from FIG. 2 on a further enlarged scale to show the fibrously hairy cauliflower structure due to the black oxide bath.
Figure 2:
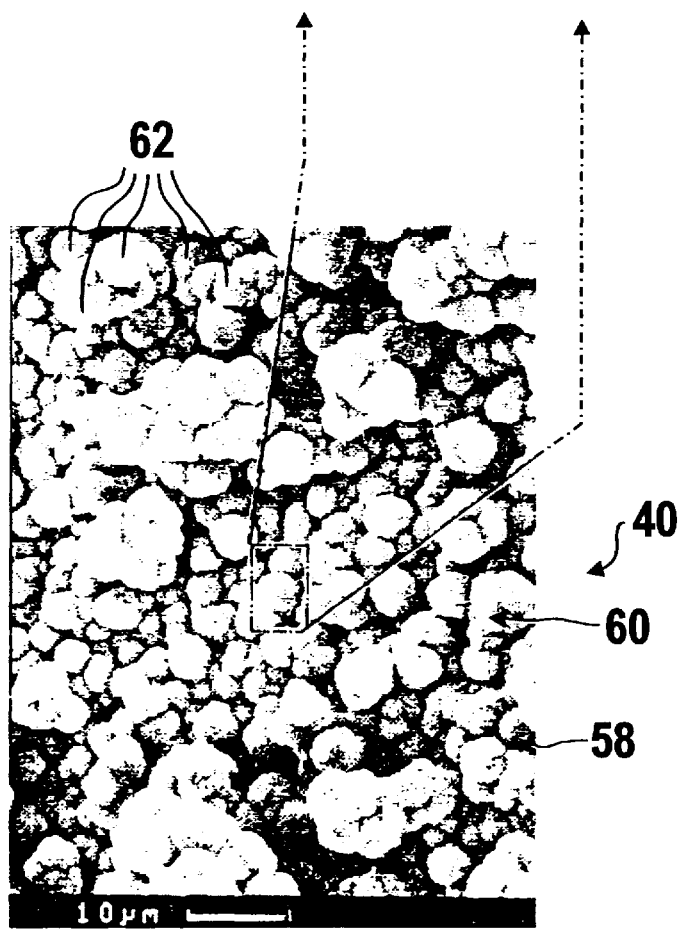
FIG. 2 shows an REM image of a portion of a metal or copper foil produced in accordance with the invention to show the cauliflower structure.

FIG. 2 shows an REM image of a surface portion of the metal or copper foil 40 according to the invention, in which the cauliflower structure 60 provided in a firmly adhering condition on the metal base layer 58 can be clearly seen. FIG. 3 again shows on an extremely enlarged scale the corresponding cauliflower particles 62 of the cauliflower structure 60 of the metal or copper foil 40 in order to show the fibers or hairs produced by the black oxide on the surface of the cauliflower particles 62.

Figure 4:
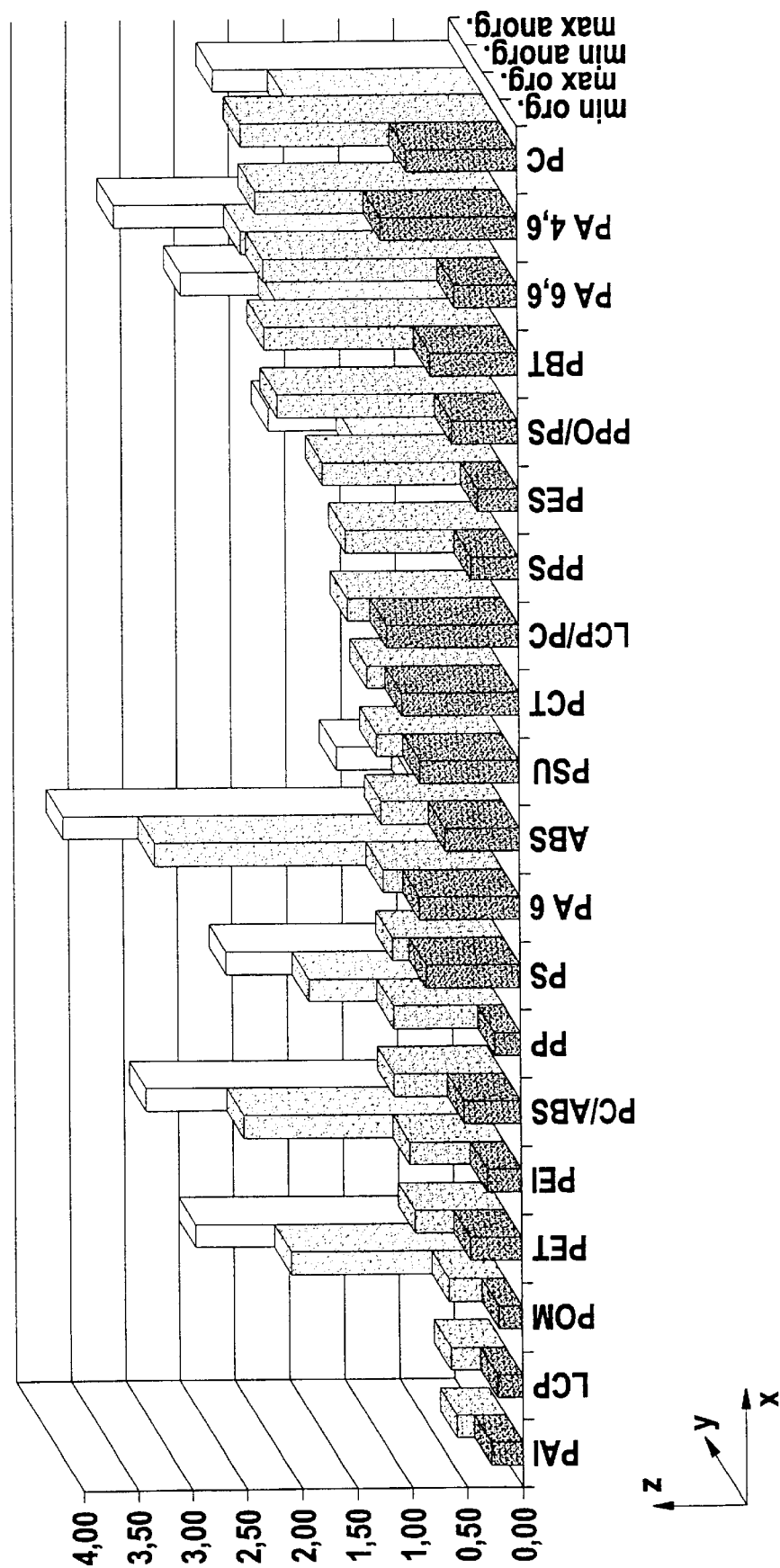
FIG. 4 is a graph to illustrate the shearing strength of a metal or copper foil produced in accordance with the invention which has been embossed on to various plastic materials, in comparison with a known metal or copper foil, which by virtue of its nature is of a low shearing strength and which can be structured in a sharp-edged configuration, which has been fixed on a suitable substrate in known manner by means of an adhesive, in particular a melt adhesive.

The cauliflower structure 60 and the fibers or hairs of the black oxide, which are formed on the cauliflower particles 62, afford excellent shearing strength for the metal or copper foil 60 produced in accordance with the invention, on substrates comprising various plastic materials, as is shown in a graph view in FIG. 4. FIG. 4 shows in the z-direction peeling strengths in accordance with IEC 326 in N/mm, in the y-direction a comparison of the peeling strengths of a known metal foil of the kind described in the opening part of this specification, which is fixed on a substrate comprising the various plastic materials by means of an organic adhesive, in comparison with a metal or copper foil 40 produced in accordance with the invention, which is simply fixed without adhesive on the corresponding substrates by the effect of heat or by hot stamping. The adhesive fixing is clearly shown in the y-direction by 'min org.' and by 'max org.'. Fixing of the foil 40 produced in accordance with the invention on the corresponding substrate and without adhesive is shown by 'min anorg.' and by 'max anorg'. The x-axis in FIG. 4 denotes various plastic materials for the corresponding substrates. It is clearly apparent from FIG. 4 that, in the case of a large number of plastic materials, the shearing strength of hot-embossed metal or copper foils according to the invention is considerably improved.

What is claimed is:

1. A process for producing a self-supporting metal foil (40), which by virtue of its constitution has a low shearing strength and can be structured in a sharp-edged configuration, wherein the metal foil (40) is galvanically deposited on a rotating roller (22) which forms a cathode and which is dipped into an electrolyte bath (10) containing ions of the metal, an anode cage (24) is provided at a constant spacing from the roller cathode (22) and a defined adjustable dc voltage is applied during rotation of the roller cathode (22) to the roller cathode (22) and the anode cage (24) so that a given adjustable high direct current flows between the roller cathode (22) and the anode cage (24) in the electrolyte bath (10), by which direct current a metal base layer (58) is deposited on the roller cathode (22), at least one additional anode (32) is provided between the roller cathode (22) and the anode cage (24), a defined adjustable second dc voltage is applied between the roller cathode (22) and the additional anode (32) so that a given adjustable additional direct current flows between the roller cathode (22) and the additional anode (32), whereby a cauliflower structure (60) comprising the metal is deposited in firmly adhering relationship on the outside of the metal base layer (58), which is remote from the roller cathode (22), the metal foil (40) comprising the metal base layer (58) provided with the cauliflower structure (60) is detached from the roller cathode (22), and the metal foil (40) comprising the metal base layer (58) provided with the cauliflower structure (60) is rinsed and dried, characterized in that the dried metal foil (40) comprising the metal base layer (58) provided with the cauliflower structure (60) is moved through a black oxide bath (46), and the metal foil (40) comprising the metal base layer (58) provided with the cauliflower structure (60), subsequently to the black oxide bath (46), is rinsed and dried.

2. A process for producing a self-supporting metal foil as recited in claim 1, wherein the metal foil is a copper foil.

* * * * *